(12) United States Patent
Kumura

(10) Patent No.: US 7,897,989 B2
(45) Date of Patent: Mar. 1, 2011

(54) LIGHT EMITTER

(75) Inventor: Masao Kumura, Tokyo (JP)

(73) Assignee: E&E Japan Co., Ltd., Tokyo (JP)

( * ) Notice: Subject to any disclaimer, the term of this patent is extended or adjusted under 35 U.S.C. 154(b) by 0 days.

(21) Appl. No.: 12/744,234

(22) PCT Filed: Nov. 21, 2007

(86) PCT No.: PCT/JP2007/073001

§ 371 (c)(1),
(2), (4) Date: Jul. 13, 2010

(87) PCT Pub. No.: WO2009/066398

PCT Pub. Date: May 28, 2009

(65) Prior Publication Data

US 2010/0289048 A1    Nov. 18, 2010

(51) Int. Cl.
*H01L 33/48* (2010.01)
*H01L 21/56* (2006.01)

(52) U.S. Cl. .................. 257/98; 257/100; 257/E33.07; 438/29

(58) Field of Classification Search ............... 257/98, 257/100, E33.07; 438/29
See application file for complete search history.

(56) References Cited

U.S. PATENT DOCUMENTS

| 2003/0151361 A1 | 8/2003 | Ishizaka |
| 2007/0012940 A1 | 1/2007 | Suh et al. |

FOREIGN PATENT DOCUMENTS

| JP | 56-19686 A | 2/1981 |
| JP | 57-37889 A | 3/1982 |
| JP | 3-206672 A | 9/1991 |
| JP | 2002-368289 A | 12/2002 |
| JP | 2003-234509 A | 8/2003 |
| JP | 2006-278675 A | 10/2006 |
| JP | 2007-27751 A | 2/2007 |

OTHER PUBLICATIONS

* International Search Report for PCT/JP2007/073001 completed Dec. 14, 2007.
* Written Opinion for PCT/JP2007/073001 completed Dec. 14, 2007.

*Primary Examiner*—Evan Pert
(74) *Attorney, Agent, or Firm*—Buchanan Ingersoll & Rooney PC

(57) ABSTRACT

The invention relates to a light emitter, such as an LED sealed with a resin, in particular, an LED wherein irregularities in a surface of a sealing resin can be formed through a simpler process in order to improve the light output efficiency of the LED. The LED is an LED wherein a liquid sealing resin is mixed with a solid transparent resin different from the sealing resin in specific gravity and subsequently the mixture is injected into a package into which an LED chip is integrated and then cured, thereby sealing the chip, characterized in that the solid transparent resin is fixed to the sealing resin to be partially naked to the sealing-resin-side surface of the LED through which light from the LED chip is emitted to the outside, and be partially embedded in the sealing resin, thereby being projected into the form of convexes. This LED is used for an LED displayer, an LCD backlight source, a lighting device or the like.

7 Claims, 4 Drawing Sheets

LIGHT EMITTER

TECHNICAL FIELD

The present invention relates to a light emitter used for a light emitting diode displayer, an LCD backlight source, a lighting device or the like, and relates in particular to a structure for improving the light output efficiency of a light emitter, such as a light emitting diode sealed with a resin.

BACKGROUND ART

Light emitting diodes (hereinafter referred to as LEDs), organic or inorganic ELs, and other devices exist as light emitters. A typical structure of a displayer, an LCD backlight or an LED for lighting, among these devices, is illustrated in FIG. 1. This is the following structure: a structure wherein a silver paste or silicone resin die-bonding agent 4 is used to die-bond an LED chip 2 onto external metal electrodes 5 inside a package having a reflecting case 1 made of a plastic or ceramic material to give a good reflectivity; the die-bonding agent 4 is cured so as to bond positive and negative electrodes of the LED chip to the external electrodes, respectively, through wires 6; a dispenser is used to inject a liquid sealing resin 3 thereinto; and then the sealing resin is cured.

The used LED chip is a chip in a single color such as R, G or B, a chip wherein these are combined with each other, or a chip giving some other luminous color, such as yellow. In the LED chip illustrated in FIG. 1, only the front surface thereof has electrodes, and the bonding thereof is attained through two wires. However, in an LED chip having front and rear surfaces having electrodes, respectively, the bonding thereof is attained through a single wire. The used wire(s) is/are (each) a gold line or aluminum line having a diameter of 25 to 30 μm. The sealing resin used therefor is an epoxy resin or silicone resin. When the material of the reflecting case is a plastic material, the material is PPA. When the material is a ceramic material, the material is $Al_2O_3$ or the like.

The refractive index of the silicone resin or epoxy resin for the sealing resin is about 1.5; therefore, when light emitted from the LED chip is taken out through the sealing resin, the light emitted in the LED chip is reflected on the interface between the sealing resin and the air so that all of the emitted light is not taken out for the following reason: as illustrated in FIG. 4, the light emitted in the LED chip 2 is reflected on the reflecting case 1, and a light ray 8 radiated into the sealing resin surface at an angle 9 of 41.8 degrees or more to the direction perpendicular to the surface is totally reflected on the sealing resin surface so that the light ray is not taken out.

Accordingly, low is the light output efficiency of any LED using a slim package (hereinafter referred to as an SPKG), which is frequently used for an LCD backlight or the like that includes an LED having the same basic structure as illustrated in FIG. 1. The light output in the case of making use of an SPKG wherein a blue chip made of InGaN showing a dominant wavelength of 460 nm is used is from 50 to 60% of the light output in the case of an LED wherein a TO-18 package illustrated in FIG. 2 is used while the same chip is used and the form of a sealing resin on the light taken-out side of the Leis a convex lens form.

Therefore, in order to improve the light output efficiency, a light scattering region in an irregular or uneven form has been hitherto formed in the surface of a sealing resin of an LED through which light is emitted. Japanese Patent Application Laid-Open (JP-A) No. 56-019686 discloses a method of making the surface of a sealing resin of an LED rough mechanically, a method of sealing an LED chip with a resin by use of a mold having a rough surface, a method of curing a sealing resin composition wherein a powdery filler is mixed with a transparent sealing resin for sealing an LED chip, and then etching a surface of the sealing resin composition with a solution wherein the filler can be dissolved, thereby making the surface rough, or some other method. JP-A No. 2002-368289 discloses a method of making fine irregularities in the surface of a sealing resin of an LED by laser ablation, and further JP-A No. 2003-234509 discloses a method of printing, on the surface of a sealing resin of an LED, a resin film wherein an irregular surface is separately formed.

These methods are not preferred since the methods make a process for producing an LED complicated. Thus, an LED has been desired which is produced through a process for forming irregularities more simply in its sealing resin surface.

DISCLOSURE OF THE INVENTION

Problems to be Solved by the Invention

An object of the invention is to make irregularities in the surface of a sealing resin not through a complicated process but through a simpler process in order to improve the light output efficiency of an LED.

Means for Solving the Problems

In a light emitter including a package having a reflecting case wherein an LED chip is wire-bonded to a die bond, and a sealing resin of a liquid resin injected into the package, the resin being cured, thereby sealing the package, it is main feature that a solid transparent resin having a specific gravity different from that of the sealing resin is fixed to be partially naked to the sealing-resin-side surface of the emitter through which light from the emitter is emitted to the outside, and be partially embedded in the sealing resin, thereby being projected into the form of convexes.

ADVANTAGEOUS EFFECTS

In the LED of the invention, the convex solid transparent resin projections are formed in the sealing resin surface; therefore, the LED has the following advantage: the light output efficiency is improved and the brightness is improved, and further light is scattered toward wide angels so that light emission is not varied in accordance with the angle of viewing; thus, light can be evenly emitted toward all directions.

REFERENCE NUMERALS

Figure 1:
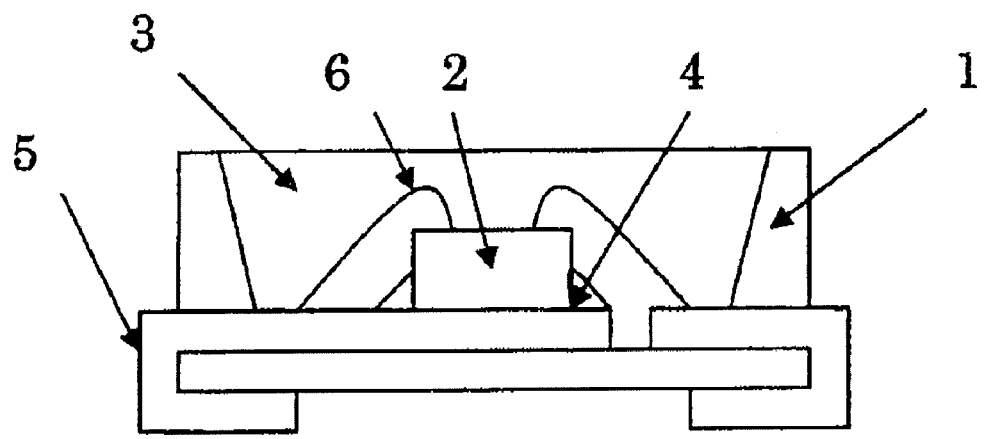
FIG. 1 is a schematic sectional view illustrating the structure of an LED in the prior art.
Figure 2:
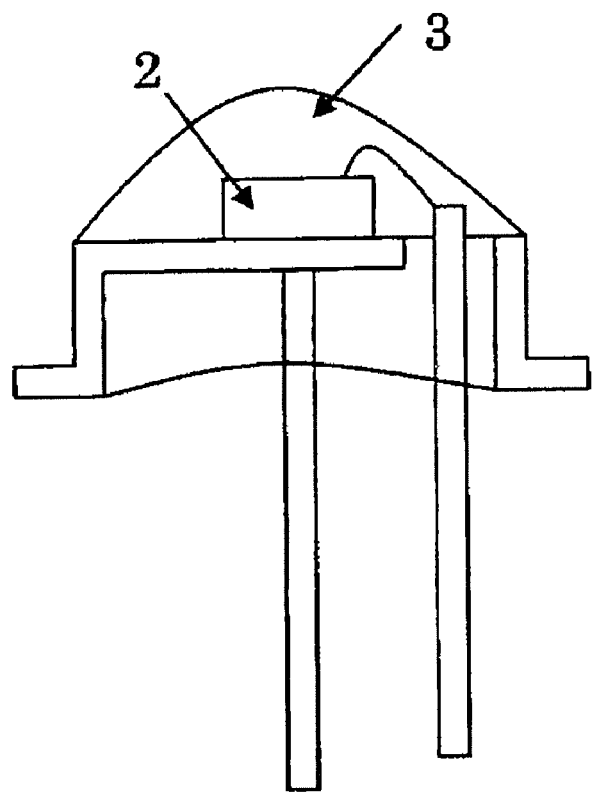
FIG. 2 is a schematic sectional view of an LED when the Leis assembled into a TO-18 package.

1 Reflecting case
2 LED chip (light emitting element)
3 Sealing resin
4 Die-bonding agent
5 Metal electrodes
6 Wires
7 Solid transparent resin
8 Light ray
9 Angle

BEST MODE FOR CARRYING OUT THE INVENTION

Figure 3:
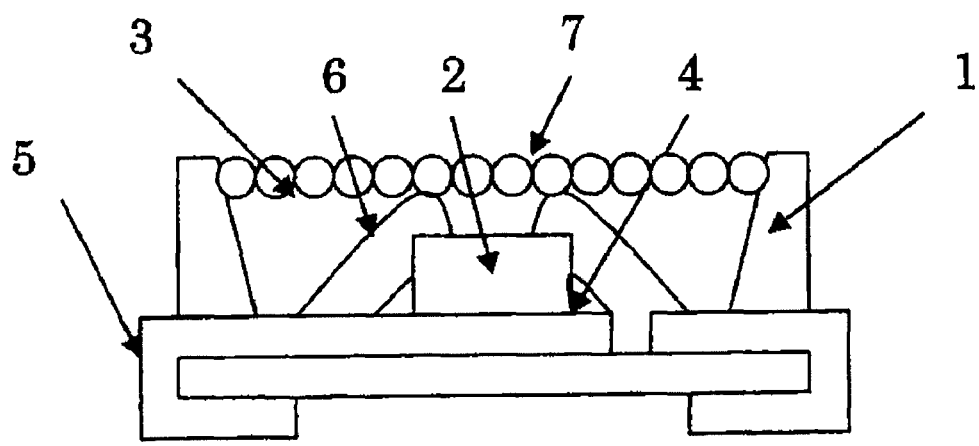
FIG. 3 is a schematic sectional view illustrating an LED of the invention.
Figure 4:
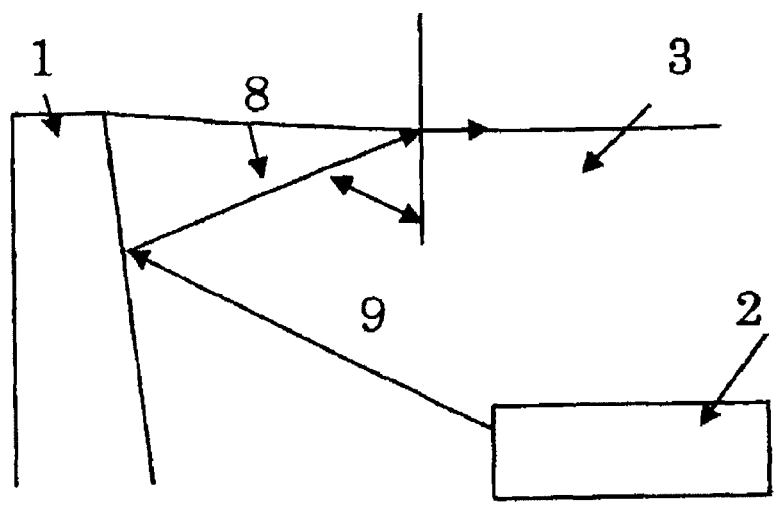
FIG. 4 is a view showing a situation that light is totally reflected on the surface of a sealing resin.
Figure 5:
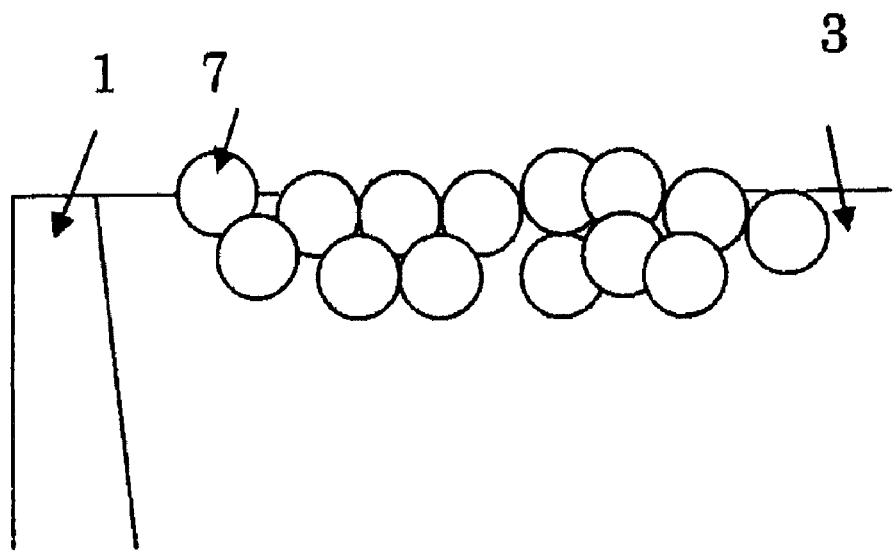
FIG. 5 is an enlarged structural view showing a relationship between a sealing resin and a solid transparent resin, the relationship being a feature of the LED of the invention.

FIG. 3 illustrates a schematic sectional view of the structure of an LED of the invention. The LED is produced by incorporating, into a liquid sealing resin, a solid transparent resin 7 having a specific gravity different from that of the sealing resin 3, injecting the mixture into a package having a reflecting case 1 wherein an LED chip 2 is wire-bonded to a die bond, causing the solid transparent resin 7 to appear partially on the surface of the sealing resin, and then curing the sealing resin, thereby forming projections of the solid transparent resin, in the form of convexes, in the sealing resin surface. As illustrated in FIG. 5, more practically, the solid transparent resin 7 is present near the surface of the sealing resin 3 in such a manner that particles of the resin 7 are unevenly put onto each other. By this matter, the light output efficiency is improved and further light is scattered toward wide angles so that light emission is not varied in accordance with the angle of viewing. Thus, the LED has an advantage that light is evenly emitted toward all directions.

The liquid sealing resin may be a silicone resin or epoxy resin that is usually used as a sealing resin. It is sufficient for the sealing resin and the solid transparent resin that the resins are different from each other in specific gravity. The difference in specific gravity between the sealing resin and the solid transparent resin is preferably 50 kg/m$^3$ or more in order to shorten the period when the solid transparent resin is shifted to the sealing resin surface after the injection of a mixture of the two resins into the package.

The solid transparent resin may be plastic particles made mainly of divinylbenzene (MICROPEARL SP, manufactured by Sekisui Chemical Co., Ltd.) or polycarbonate, or particles made of polypropylene or epoxy resin.

It is more preferred that the form of the solid transparent resin is closer to a sphere since the viscosity thereof becomes lower when the resin is incorporated into the liquid resin. However, even when the solid transparent resin has a different shape, the light output efficiency is improved. The average particle diameter of the solid transparent resin is preferably from 5 to 80 μm. If the average particle diameter is less than 5 μm, the period when the solid transparent resin makes its appearance on the sealing resin surface is long and further the resin aggregates easily. If the average particle diameter is more than 80 μm, the state that the solid transparent resin makes its appearance on the sealing resin surface is unstable. The particle size distribution of the solid transparent resin is preferably narrow in order for the solid transparent resin to be evenly present on the sealing resin surface. The blend proportion of the solid transparent resin is preferably from 1 to 20% by weight from the viewpoint of the viscosity of the mixture and the light output efficiency. If the proportion is less than 1% by weight, the light output efficiency becomes small. If the proportion is 20% or more by weight, the viscosity of the mixture becomes large so that the period when the solid transparent resin makes its appearance on the sealing resin surface becomes long.

Figure 7:
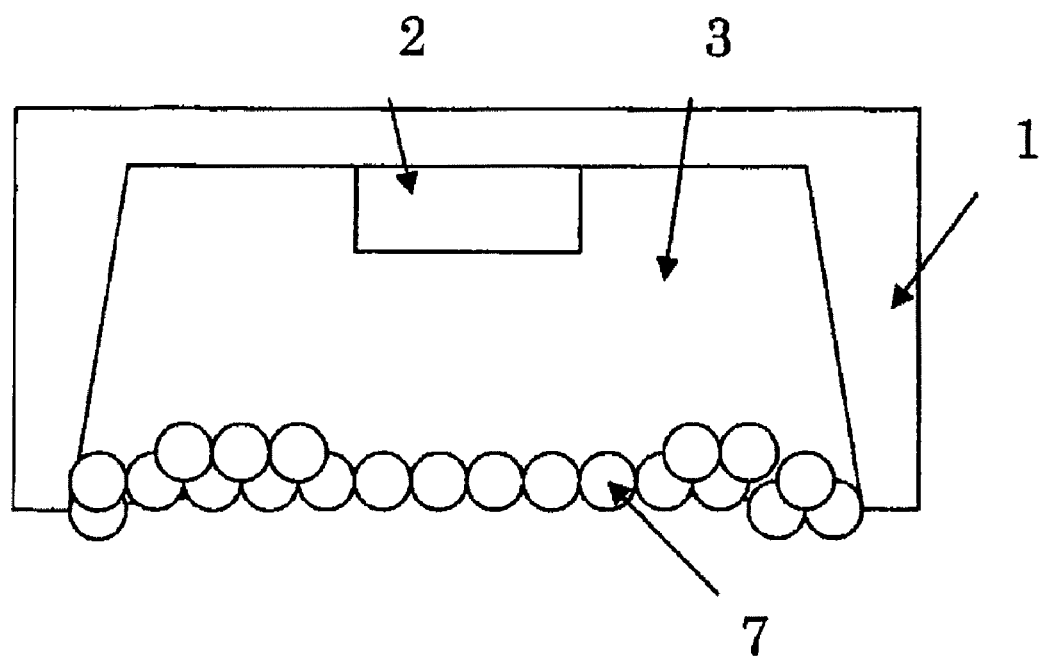
FIG. 7 is a view of a situation that when the specific gravity of a solid transparent resin is larger than that of a liquid sealing material, the latter resin is cured in the state that a package is turned downward.

When the specific gravity of the solid transparent resin is smaller than that of the sealing resin, the solid transparent resin rises to the surface of the sealing resin so that one part thereof sticks out from the sealing resin surface to turn into the form of convexes. When the specific gravity of the solid transparent resin is larger than that of the sealing resin, the solid transparent resin can be made into the form of convexes on the sealing resin surface by turning the sealing resin surface inside the package having the reflecting case to the direction of gravity before the sealing resin is cured. This state is illustrated as a schematic sectional view in FIG. 7. When the particle diameter of the solid transparent resin is large, it is preferred to put the solid transparent resin, on which a releasing agent is painted, onto the resin surface, and upset the package.

Figure 6:
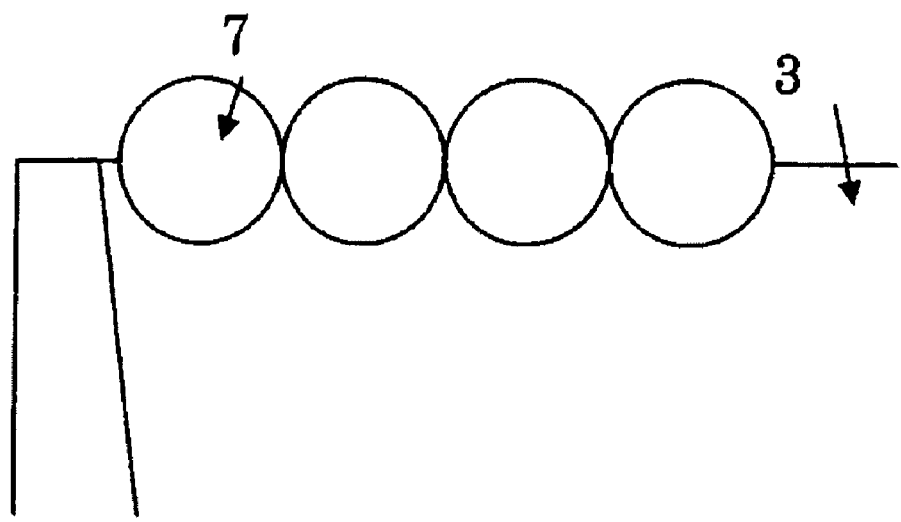
FIG. 6 is a sectional view of a structure in the case of injecting a sealing resin into a package at two stages.

The injection of the sealing resin into the package having the reflecting case may be conducted at two stages. Only the sealing resin is first injected into the package over the middle of the depth thereof, and then the sealing resin with which the solid transparent resin is blended is injected thereinto. The period when the solid transparent resin makes its appearance on the sealing resin surface can be made short. Simultaneously, as illustrated in FIG. 6, the solid transparent resin 7 comes to be evener present on the surface of the sealing resin 3, so that the light output efficiency can be made large.

The LED element that can be used may be an LED element in some other color, such as blue or white, or an LED wherein these are combined with each other, such as RGB.

Example 1

By an MOCVD epitaxial growing method, the following was formed on a C-surface sapphire substrate: a wafer which had a light emitting structure having a light emitting layer of InGaN and giving a dominant wavelength of 460 nm. The sapphire substrate was then polished into a thickness of about 100 μm. The wafer was then cut by a scribing method to form blue LED chips each having a size of 0.35 mm×0.35 mm. Next, prepared was a lead frame on which many packages in which of each a reflecting case was formed by injection mold were put, and the blue LED chips were die-bonded into the packages on the lead frame by a die-bonding agent made of a silicone resin. The agent was then cured. Thereafter, gold lines each having a diameter of 25 μm were used to carry out wire bonding on the anode side and the cathode side.

As a silicone resin of a sealing resin, a resin SRC 1011 manufactured by Shin-Etsu Chemical Co., Ltd was used. The specific gravity of this resin was 1.1×10$^3$ kg/m$^3$. As plastic balls as a solid transparent resin, balls MICROPEARL SP manufactured by Sekisui Chemical Co., Ltd. were used. The diameter of the plastic balls was about 30 μm, and the specific gravity thereof was 1.19×10$^3$ kg/m$^3$. The plastic balls were incorporated into the silicone resin to give a proportion of 5% by weight, and then the mixture was injected into the packages by means of a fixed quantity dispenser. After the injection of the resin mixture, the mixture was cured in the state that the lead frame was upset, that is, the sealing resin surface was turned downward.

The light output of the thus-formed LED was 20% better than that of an LED wherein no plastic balls were used.

Example 2

An LED was formed in the same way as in Example 1 except that the plastic balls the particle diameter of which was changed to 10 μm were used in a proportion of 3% by weight in Example 1. The light output of the LED was measured. As a result, the light output was 15% better than that of an LED wherein no plastic balls were used.

Example 3

By an MOCVD epitaxial growing method, the following was formed on a C-surface sapphire substrate: a wafer which had a light emitting structure having a light emitting layer of InGaN and giving a dominant wavelength of 460 nm. The sapphire substrate was then polished into a thickness of about 100 μm. The wafer was then cut by a scribing method to form blue LED chips each having a size of 0.35 mm×0.35 mm. Next, prepared was a lead frame on which many packages in which of each a reflecting case was formed by injection mold were put, and the blue LED chips were die-bonded into the packages on the lead frame by a die-bonding agent made of a silicone resin. The agent was then cured. Thereafter, gold lines each having a diameter of 25 μm were used to carry out wire bonding on the anode side and the cathode side. The size of the opening in each of the packages, that is, the upper end size of each of the reflecting cases was 0.7 mm×0.7 mm.

As a solid transparent resin, plastic balls described in Example 1 were used. Prepared were beforehand tools on which of each the balls were able to be thinly scattered into a size of 0.7 mm×0.7 mm. As a sealing resin, a silicone resin described in Example 1 was used, and the resin was injected into the packages by means of a fixed quantity dispenser. After the injection of the resin, the resin was cured in the state that the lead frame was upset and further the openings in the packages and the beforehand-prepared tools on which of each the plastic balls were scattered were put together. The plastic balls were transferred onto the sealing resin side.

The light output of the thus-formed LED was 25% better than that of an LED wherein no plastic balls were used.

INDUSTRIAL APPLICABILITY

The invention can be used for an LED displayer, an LCD backlight source, a lighting device or the like about which a large light output is required.

The invention claimed is:

1. A light emitter, comprising a package into which a light emitting element is integrated, and a sealing resin of a liquid resin injected into the package, the resin being cured, thereby sealing the package, and projections in the form of convexes being formed in a surface of the sealing resin through which light from the light emitting element is emitted outward,
wherein the convex-form projections in the surface of the sealing resin are formed by a matter that a solid spherical transparent resin which is different from the sealing resin in specific gravity by 50 kg/m³ or more and has an average particle diameter of 5 to 80 μm is fixed to the surface of the sealing resin in the state that one part of the spherical transparent resin is naked to the surface of the sealing resin and the other portion thereof is embedded in the sealing resin.

2. A process for producing a light emitter comprising a package into which a light emitting element is integrated, and a sealing resin of a liquid resin injected into the package, the resin being cured, thereby sealing the package, and projections in the form of convexes being formed in a surface of the sealing resin through which light from the light emitting element is emitted outward,
wherein a mixture of the sealing resin of the liquid resin and a solid spherical transparent resin different from the sealing resin in specific gravity is injected into the package, and then the curing and the sealing are conducted,
thereby fixing the solid spherical transparent resin onto the surface of the sealing resin in the state that one part of the solid spherical transparent resin is naked to the surface of the sealing resin and the other portion thereof is embedded in the sealing resin, so as to form the convex-form projections in the surface of the sealing resin.

3. A process for producing a light emitter comprising a package into which a light emitting element is integrated, and a sealing resin of a liquid resin injected into the package, the resin being cured, thereby sealing the package, and projections in the form of convexes being formed in a surface of the sealing resin through which light from the light emitting element is emitted outward,
wherein the sealing resin of the liquid resin is injected into the package over the middle of the depth of the package, and then
a mixture of the sealing resin of the liquid resin and a solid spherical transparent resin different from the sealing resin in specific gravity is injected onto the sealing resin injected into the package over the middle of the package, and then the curing and the sealing are conducted,
thereby fixing the solid spherical transparent resin onto the surface of the sealing resin in the state that one part of the solid spherical transparent resin is naked to the surface of the sealing resin and the other portion thereof is embedded in the sealing resin, so as to form the convex-form projections in the surface of the sealing resin.

4. The process for producing a light emitter according to claim 2, wherein the mixture of the sealing resin of the liquid resin and the solid spherical transparent resin different from the sealing resin in specific gravity is injected into the package, and then the mixture in the package is turned to the direction of gravity.

5. The process for producing a light emitter according to claim 2, wherein the difference in specific gravity between the sealing resin of the liquid resin and the solid spherical transparent resin is 50 kg/m³ or more.

6. The process for producing a light emitter according to claim 2, wherein the solid spherical transparent resin has an average particle diameter of 5 to 80 μm.

7. The process for producing a light emitter according to claim 2, wherein the amount of the solid spherical transparent resin in the mixture of the sealing resin of the liquid resin and the solid spherical transparent resin different from the sealing resin in specific gravity is from 1 to 20% by weight.

* * * * *